(12) United States Patent
Jo et al.

(10) Patent No.: US 11,239,274 B2
(45) Date of Patent: Feb. 1, 2022

(54) IMAGE SENSOR FOR HIGH PHOTOELECTRIC CONVERSION EFFICIENCY AND LOW DARK CURRENT

(71) Applicant: Samsung Electronics Co., Ltd., Suwon-si (KR)

(72) Inventors: Sanghyun Jo, Seoul (KR); Jaeho Lee, Seoul (KR); Eunkyu Lee, Yongin-si (KR); Seongjun Park, Seoul (KR); Kiyoung Lee, Seoul (KR); Jinseong Heo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 233 days.

(21) Appl. No.: 15/800,229

(22) Filed: Nov. 1, 2017

(65) Prior Publication Data
US 2018/0130843 A1 May 10, 2018

(30) Foreign Application Priority Data

Nov. 8, 2016 (KR) .................. 10-2016-0148186

(51) Int. Cl.
*H01L 27/146* (2006.01)
*H01L 31/074* (2012.01)
(Continued)

(52) U.S. Cl.
CPC .. *H01L 27/14667* (2013.01); *H01L 27/14636* (2013.01); *H01L 31/0264* (2013.01); *H01L 31/074* (2013.01); *B82Y 15/00* (2013.01)

(58) Field of Classification Search
CPC ......... H01L 27/14667; H01L 27/14636; H01L 31/0264; H01L 31/074; B82Y 15/00
See application file for complete search history.

(56) References Cited

U.S. PATENT DOCUMENTS 7,816,713 B2 * 10/2010 Kim .................. H01L 27/14647
257/290
2009/0090903 A1 4/2009 Kim et al.
(Continued)

FOREIGN PATENT DOCUMENTS

| CN | 103579419 A | 2/2014 |
| CN | 106169511 A | 11/2016 |

(Continued)

OTHER PUBLICATIONS

M. Massicotte et al., "Photo-thermionic effect in verticle graphene heterostructures", Nature Communications 7, Article No. 12174, 2016.
(Continued)

*Primary Examiner* — Timor Karimy
(74) *Attorney, Agent, or Firm* — Harness, Dickey & Pierce, P.L.C.

(57) ABSTRACT

Example embodiments relate to an image sensor configured to achieve a high photoelectric conversion efficiency and a low dark current. The image sensor includes first and second electrodes, a plurality of photodetection layers provided between the first and second electrodes, and an interlayer provided between the photodetection layers. The photodetection layers convert incident light into an electrical signal and include a semiconductor material. The interlayer includes a metallic or semi metallic material having anisotropy in electrical conductivity.

11 Claims, 12 Drawing Sheets

(51) Int. Cl.
    *H01L 31/0264*     (2006.01)
    *B82Y 15/00*     (2011.01)

(56) References Cited

U.S. PATENT DOCUMENTS

| | | | | |
|---|---|---|---|---|
| 2010/0206362 | A1* | 8/2010 | Flood | H01L 31/0336 |
| | | | | 136/252 |
| 2011/0108884 | A1* | 5/2011 | Uetani | H01L 51/4253 |
| | | | | 257/184 |
| 2014/0264275 | A1 | 9/2014 | Zhong et al. | |
| 2015/0295001 | A1 | 10/2015 | Choi et al. | |
| 2016/0111457 | A1 | 4/2016 | Sekine | |
| 2016/0343891 | A1 | 11/2016 | Heo et al. | |
| 2016/0359062 | A1 | 12/2016 | Heo et al. | |

FOREIGN PATENT DOCUMENTS

| | | |
|---|---|---|
| EP | 3096359 A1 | 11/2016 |
| JP | 2003-231097 A | 8/2003 |
| JP | 2010-041022 A | 2/2010 |
| JP | 2010-103457 A | 5/2010 |
| JP | 2014-017468 A | 1/2014 |
| JP | 2014-239158 A | 12/2014 |
| JP | 2016-033950 A | 3/2016 |
| JP | 2016-047777 A | 4/2016 |
| JP | 2016-076484 A | 5/2016 |
| JP | 2016-097599 A | 5/2016 |
| JP | 2016-219805 A | 12/2016 |
| KR | 10-1558801 B1 | 10/2015 |
| WO | WO-2013/065621 A1 | 5/2013 |
| WO | WO-2015/067335 A1 | 5/2015 |
| WO | WO-2015/098574 A1 | 7/2015 |

OTHER PUBLICATIONS

Chul-Ho Lee et al., "Atomically thin p-n junctions with van der Waals heterointerfaces", Nature Nanotechnology, vol. 9, Sep. 2014, pp. 676-681.
PhaniKiran Vabbina et al., "Highly Sensitive Wide Bandwidth Photodector Based on Internal Photoemission in CVD Grown p-Type MoS2/Graphene Schottky Junction", ACS Applied Materials and Interfaces.
M. Massicotte et al., "Photo-thermionic effect in verticle graphene heterostructures", arXiv.org.
Extended European Search Report dated Apr. 12, 2018 for corresponding European Application No. 17200439.2.
Ren-Jye Shiue et al.: "High-Responsivity Graphene-Boron Nitride Photodetector and Autocorrelator in a Silicon Photonic Integrated Circuit", Nano Letters, vol. 15, No. 11, Oct. 7, 2015, pp. 7288-7293, XP055463408.
Yuka Tsuboi et al.: "Enhanced photovoltaic performances of graphene/Si solar cells by insertion of a $MoS_2$ thin film", Nanoscale, vol. 7, No. 34, Jan. 1, 2015, pp. 14476-14482, XP055455309.
Jingang Wang et al.: "Electrical properties and applications of graphene, hexagonal boron nitride (h-BN), and graphene/h-BN heterostructures", Materials Today Physics, vol. 2, Jul. 11, 2017, pp. 6-34, XP055463413.
Xiaoqiang Li et al.: "Graphene/h-BN/GaAs sandwich diode as solar cell and photodetector", Optics Express, vol. 24, No. 1, Jan. 5, 2016, p. 134, XP055463395.
Yang Li et al.: "Photodiode-Like Behavior and Excellent Photorsponse of Vertical Si/Monolayer $MoS_2$ Heterostructures", Scientific Reports, vol. 4, No. 1, Nov. 26, 2014, XP055463516.
University of Cambridge, Anisotropic Electrical Conductivity, 1 page, http://www.doitpoms.ac.uk/tlplib/anisotropy/electrical.php <https://protect-us.mimecast.com/s/-PDWCR6MOkCr81GMh9MTWb>, 2004-2020.
Office Action dated Oct. 18, 2021 issued in corresponding Japanese Patent Application No. 2017-183395.

* cited by examiner

IMAGE SENSOR FOR HIGH PHOTOELECTRIC CONVERSION EFFICIENCY AND LOW DARK CURRENT

CROSS-REFERENCE TO RELATED APPLICATION

This application claims the benefit of priority from Korean Patent Application No. 10-2016-0148186, filed on Nov. 8, 2016, in the Korean Intellectual Property Office, the disclosure of which is incorporated herein in its entirety by reference.

BACKGROUND

1. Field

Example embodiments relate to image sensors and/or to image sensors configured to achieve a high photoelectric conversion efficiency and/or a low dark current.

2. Description of the Related Art

An image sensor generally refers to a photoelectric device for converting an optical image into an electrical signal, and is used in various fields, e.g., cameras, motion recognition cameras, touch panels, light detection and ranging (LiDAR) systems, and three-dimensional (3D) sensors. Currently, a silicon-based complementary metal-oxide semiconductor (CMOS) image sensor, which is easily producible and highly reliable, is being developed.

When used at a low light level or in a LiDAR system or a 3D sensor, an image sensor may detect a small optical signal. As such, an image sensor capable of achieving a high photoelectric conversion efficiency is advantageous.

SUMMARY

Example embodiments relate to image sensors capable of both achieving a high photoelectric conversion efficiency and a low dark current.

Additional example embodiments will be set forth in part in the description which follows and, in part, will be apparent from the description, or may be learned by practice of the example embodiments.

According to an example embodiment, an image sensor includes first and second electrodes spaced apart from each other, a plurality of photodetection layers provided between the first and second electrodes to convert incident light into an electrical signal, and including a semiconductor material, and an interlayer provided between the photodetection layers and including a metallic or semi metallic material having anisotropy in electrical conductivity.

The interlayer may have a lower electrical conductivity in a direction substantially perpendicular to the interlayer, compared to an electrical conductivity in a direction substantially parallel to the interlayer. Photocurrent may be generated between the photodetection layers and the interlayer due to incident light.

The interlayer may include graphene having at least one layer, or $WTe_2$. The interlayer may have a thickness of about 0.05 nm to about 10 cm. For example, the interlayer may have a thickness of about 0.1 nm to about 100 µm.

The photodetection layers may include at least one of, for example, silicon (Si), transition metal dichalcogenides (TMDC), quantum dots, and an organic semiconductor material. The TMDC may include, for example, one transition metal such as molybdenum (Mo), tungsten (W), niobium (Nb), vanadium (V), tantalum (Ta), titanium (Ti), zirconium (Zr), hafnium (Hf), technetium (Tc), rhenium (Re), and copper (Cu), and one chalcogen element such as sulfur (S), selenium (Se), and tellurium (Te).

At least one of the first and second electrodes may be a transparent electrode. The transparent electrode may include, for example, transparent conductive oxide (TCO) or graphene.

Photoelectric conversion efficiency and dark current may be adjusted by controlling a Fermi level of at least one of the photodetection layers and the interlayer. Alternatively, photoelectric conversion efficiency and dark current may be adjusted by controlling a thickness of the interlayer and a doping density of at least one of the photodetection layers and the interlayer.

According to an example embodiment, an image sensor includes a substrate, a first electrode spaced apart from and provided above the substrate, a plurality of photodetection layers provided between the first electrode and the substrate to convert incident light into an electrical signal, and including a semiconductor material, and an interlayer provided between the photodetection layers and including a metallic or semi metallic material having anisotropy in electrical conductivity.

The substrate may include a conductive substrate. The conductive substrate may include, for example, a silicon substrate.

The image sensor may further include an insulating layer provided between the substrate and the photodetection layer provided above the substrate. In this case, the substrate and the photodetection layer provided above the substrate may be electrically connected to each other through a via hole provided in the insulating layer.

The image sensor may further include a second electrode provided between the insulating layer and the photodetection layer provided above the insulating layer.

The substrate may include an insulating substrate. In this case, the image sensor may further include a second electrode provided on the substrate.

The interlayer may have a lower electrical conductivity in a direction perpendicular to the interlayer compared to an electrical conductivity in a direction parallel to the interlayer. The interlayer may include, for example, graphene having at least one layer, or $WTe_2$. The interlayer may have a thickness of, for example, about 0.05 nm to about 10 cm.

The photodetection layers may include at least one of, for example, silicon (Si), transition metal dichalcogenides (TMDC), quantum dots, and an organic semiconductor material.

The first electrode may be a transparent electrode. The transparent electrode may include, for example, transparent conductive oxide (TCO) or graphene.

Example embodiments relate to an image sensor including first and second electrodes separated by a plurality of photodetection layers, and one or more of the plurality of photodetection layers including a semiconductor material, and an interlayer between the photodetection layers, the interlayer having anisotropy in electrical conductivity.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Figure 1:
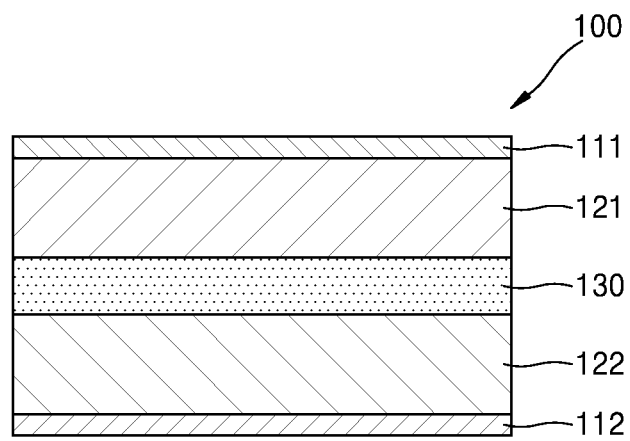
FIG. 1 is a cross-sectional view of an image sensor according to an example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures. Expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

FIG. 1 is a cross-sectional view of an image sensor 100 according to an example embodiment.

Referring to FIG. 1, the image sensor 100 includes first and second electrodes 111 and 112 spaced apart from each other, first and second photodetection layers 121 and 122 provided between the first and second electrodes 111 and 112, and an interlayer 130 provided between the first and second photodetection layers 121 and 122.

The first and second electrodes 111 and 112 may be, for example, an upper electrode and a lower electrode, respectively. At least one of the first and second electrodes 111 and 112 may be a transparent electrode. For example, when external light is incident on the first electrode 111 serving as an upper electrode, the first electrode 111 may be a transparent electrode. In this case, the second electrode 112 may be a metal electrode. However, the second electrode 112 is not limited thereto and may also be a transparent electrode like the first electrode 111.

The transparent electrode may include, for example, transparent conductive oxide (TCO) or graphene. Herein, TCO may include at least one material selected from, for example, indium tin oxide (ITO), indium zinc oxide (IZO), ZnO, $SnO_2$, antimony-doped tin oxide (ATO), aluminum-doped zinc oxide (AZO), gallium-doped zinc oxide (GZO), $TiO_2$, and fluorine-doped tin oxide (FTO). However, TCO is not limited thereto. Graphene may have a monolayer or multilayer structure. The metal electrode may include at least one material selected from the group consisting of, for example, aluminum (Al), copper (Cu), titanium (Ti), gold (Au), platinum (Pt), silver (Ag), and chromium (Cr). However, the metal electrode is not limited thereto.

When external light is incident on the second electrode 112 serving as a lower electrode, the second electrode 112 may be a transparent electrode and the first electrode 111 may be a metal electrode. However, the first electrode 111 is not limited thereto and may also be a transparent electrode like the second electrode 112.

The first and second photodetection layers 121 and 122 are stacked on one another between the first and second electrodes 111 and 112. The first photodetection layer 121 is provided on a bottom surface of the first electrode 111, and the second photodetection layer 122 is provided on a top surface of the second electrode 112.

The first and second photodetection layers 121 and 122 convert incident light into an electrical signal, and may include a semiconductor material. Herein, the first and second photodetection layers 121 and 122 may convert light of a certain color into an electrical signal. For example, the first and second photodetection layers 121 and 122 may convert one of red light, green light, and blue light into an electrical signal depending on the semiconductor material. However, the first and second photodetection layers 121 and 122 are not limited thereto and may convert light of various other colors into an electrical signal.

The semiconductor material of the first and second photodetection layers 121 and 122 may include at least one of, for example, silicon (Si), transition metal dichalcogenides (TMDC), quantum dots, and an organic semiconductor material, but is not limited thereto.

TMDC refers to a semiconductor material having a two-dimensional (2D) crystal structure. TMDC may include one transition metal selected among molybdenum (Mo), tungsten (W), niobium (Nb), vanadium (V), tantalum (Ta), titanium (Ti), zirconium (Zr), hafnium (Hf), technetium (Tc), rhenium (Re), and copper (Cu), and one chalcogen element selected among sulfur (S), selenium (Se), and tellurium (Te). For example, TMDC may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or CuS. However, the above-mentioned materials are merely examples, and TMDC may include other materials.

The semiconductor material of the first and second photodetection layers 121 and 122 may be doped with a p-type dopant or an n-type dopant to adjust photocurrent or dark current. The p-type dopant or the n-type dopant may be doped using, for example, ion implantation or chemical doping.

A source of the p-type dopant may include, for example, an ionic liquid such as $NO_2BF_4$, $NOBF_4$, or $NO_2SbF_6$, an acidic compound such as HCl, $H_2PO_4$, $CH_3COOH$, $H_2SO_4$, or $HNO_3$, or an organic compound such as dichlorodicyanoquinone (DDQ), oxone, dimyristoylphosphatidylinositol (DMPI), or trifluoromethanesulfonimide. Alternatively, the source of the p-type dopant may include $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, or the like.

A source of the n-type dopant may include, for example, a reduction product of a substituted or unsubstituted nicotinamide, a reduction product of a compound which is chemically bound to a substituted or unsubstituted nicotinamide, or a compound comprising at least two pyridinium moieties in which a nitrogen atom of at least one the pyridinium moieties is reduced. For example, the source of the n-type dopant may include nicotinamide mononucleotide-H (NMNH), nicotinamide adenine dinucleotide-H (NADH), or nicotinamide adenine dinucleotide phosphate-H (NADPH), or include viologen. Alternatively, the source of the n-type dopant may include polymer such as polyethylenimine (PEI). Otherwise, the n-type dopant may include alkali metal such as potassium (K) or lithium (Li). The above-mentioned p-type and n-type dopant materials are merely examples, and various other materials may be used as dopants.

The interlayer 130 is provided between the first and second photodetection layers 121 and 122. Herein, the interlayer 130 may increase photoelectric conversion efficiency and reduce dark current. To this end, the interlayer 130 may include a metallic or semi metallic material having anisotropy in electrical conductivity. Herein, the anisotropy in electrical conductivity of the interlayer 130 indicates that electrical conductivity in a direction substantially perpendicular to the interlayer 130 is lower than the electrical conductivity in a direction substantially parallel to the interlayer 130.

The metallic material or semi metallic material of the interlayer 130 having anisotropy in electrical conductivity may include, for example, graphene or $WTe_2$. Graphene has a good electrical conductivity in a planar direction, but has a lower electrical conductivity in a direction substantially perpendicular to the planar direction. Like graphene, electrical conductivity of $WTe_2$ in the planar direction may be substantially greater than the electrical conductivity thereof in the direction substantially perpendicular to the planar direction.

Graphene of the interlayer 130 may have, for example, a multilayer structure. However, graphene is not limited thereto and may have a monolayer structure. The above-mentioned materials of the interlayer 130 are merely examples and the interlayer 130 may include various other materials. The interlayer 130 may have a thickness of, for example, about 0.05 nm to about 10 cm. Specifically, the interlayer 130 may have a thickness of about 0.1 nm to about 100 μm, but is not limited thereto.

Similarly to the above-described first and second photodetection layers 121 and 122, the material of the interlayer 130 may be doped with a p-type dopant or an n-type dopant. As described above, at least one of the first and second photodetection layers 121 and 122 and the interlayer 130 may not be doped or doped with a dopant.

Generally, since photoelectric conversion efficiency and dark current of an image sensor using only photodetection layers are determined based on unique characteristics (e.g., a band gap or electrical conductivity) of a material used for the photodetection layers of the image sensor, a high photoelectric conversion efficiency and/or a low dark current band may not be achieved in a desired wavelength band.

To address the above, photoelectric conversion efficiency may be increased by inserting a light absorbing layer, or dark current may be reduced by inserting a blocking layer. However, the light absorbing layer may increase the photoelectric conversion efficiency but may not reduce the dark current, and the blocking layer may reduce the dark current but may also reduce photocurrent and thus lower the photoelectric conversion efficiency.

In an example embodiment, a high photoelectric conversion efficiency and/or a low dark current may be achieved by inserting the interlayer 130 including the metallic or semi metallic material having anisotropy in electrical conductivity, between the first and second photodetection layers 121 and 122. Herein, the metallic or semi metallic material having anisotropy in electrical conductivity, e.g., multilayer graphene, has a good electrical conductivity in a planar direction and has a very low electrical conductivity in a direction perpendicular to the planar direction. Accordingly, when multilayer graphene serving as the interlayer 130 is inserted between the first and second photodetection layers 121 and 122, the interlayer 130 may be as the above-described blocking layer and thus reduce dark current. Herein, the dark current may be adjusted based on the thickness of the metallic or semi metallic material of the interlayer 130. The dark current may also be adjusted based on band alignment between the semiconductor material of the first and second photodetection layers 121 and 122 and the metallic or semi metallic material of the interlayer 130. The band alignment may be performed by controlling a Fermi level of at least one of the semiconductor material of the first and second photodetection layers 121 and 122 and the metallic or semi metallic material of the interlayer 130. The Fermi level may be controlled by adjusting, for example, a doping density of at least one of the semiconductor material of the first and second photodetection layers 121 and 122 and the metallic or semi metallic material of the interlayer 130.

When external light is incident on the image sensor 100, unlike the above-described blocking layer, the interlayer 130 inserted between the first and second photodetection layers 121 and 122 may absorb external light and generate photocurrent between the first and second photodetection layers 121 and 122 and the interlayer 130.

The interlayer 130 including the metallic or semi metallic material having anisotropy in electrical conductivity may absorb external light and generate photocurrent due to an internal photoemission effect, a photo-thermionic effect, a band-to-band excitation effect, or the like. When a band alignment difference (e.g., a Fermi level difference) between the first and second photodetection layers 121 and 122 and the interlayer 130 is less than incident light energy, a photocurrent may be generated between the first and second photodetection layers 121 and 122 and the interlayer 130 due to an internal photoemission effect and a photo-thermionic effect. When a band alignment difference (e.g., a Fermi level difference) between the first and second photodetection layers 121 and 122 and the interlayer 130 is greater than incident light energy, a photocurrent may be generated between the first and second photodetection layers 121 and 122 and the interlayer 130 due to a photo-thermionic effect. In addition, the interlayer 130 including the metallic or semi metallic material having anisotropy in electrical conductivity may absorb external light and generate photocurrent between the first and second photodetection layers 121 and 122 and the interlayer 130 due to a band-to-band excitation effect.

Similarly to the above-described dark current, photoelectric conversion efficiency may be adjusted based on the thickness of the interlayer 130. The photoelectric conversion efficiency may also be adjusted based on band alignment between the semiconductor material of the first and second photodetection layers 121 and 122 and the metallic or semi metallic material of the interlayer 130. The band alignment may be performed by controlling a Fermi level of at least one of the semiconductor material of the first and second photodetection layers 121 and 122 and the metallic or semi metallic material of the interlayer 130. The Fermi level may be controlled by adjusting, for example, a doping density of at least one of the semiconductor material of the first and second photodetection layers 121 and 122 and the metallic or semi metallic material of the interlayer 130.

As described above, when external light is incident on the image sensor 100, since the first and second photodetection layers 121 and 122 generate photocurrent and the interlayer 130 inserted between the first and second photodetection layers 121 and 122 additionally generates photocurrent, photoelectric conversion efficiency may be increased.

In the image sensor 100 according to an example embodiment, since the interlayer 130 including the metallic or semi metallic material having anisotropy in electrical conductivity is inserted between the first and second photodetection layers 121 and 122, when external light is not incident on the image sensor 100, dark current may be reduced. In addition, when external light is incident on the image sensor 100, since the interlayer 130 may additionally generate a photocurrent between the first and second photodetection layers 121 and 122 and the interlayer 130, the photoelectric conversion efficiency may be increased. As such, the image sensor 100 capable of both achieving a high photoelectric conversion efficiency and a low dark current may be implemented.

As described above, an image sensor, a LiDAR system, or a 3D sensor may be able to detect a small optical signal in a low light level environment, and thus may benefit from a high photoelectric conversion efficiency. Therefore, if the image sensor 100 according to an example embodiment is applied to a low light level environment, a LiDAR system, or a 3D sensor, dark current may be reduced and a small optical signal may be detected due to a high photoelectric conversion efficiency.

Figure 2A:
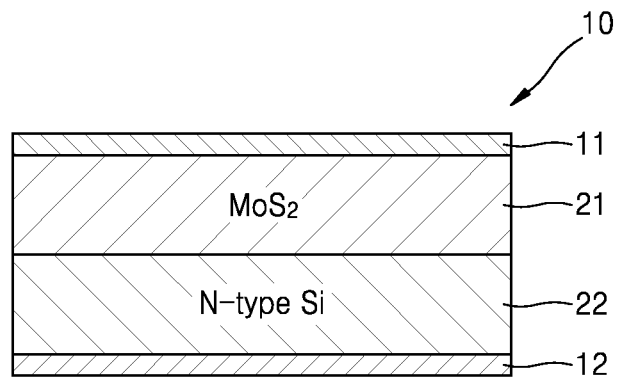
FIG. 2A is a cross-sectional view of an image sensor having a general structure.
Figure 2B:
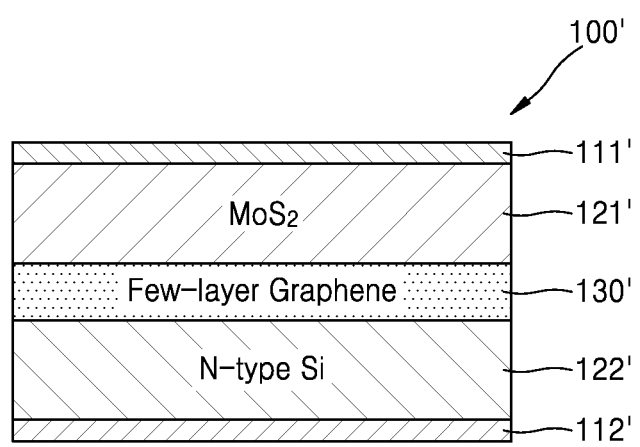
FIG. 2B is a cross-sectional view of an image sensor according to an example embodiment.

FIGS. 2A and 2B are cross-sectional views of an image sensor 10 having a general structure and an image sensor 100' according to an example embodiment.

FIG. 2A illustrates the image sensor 10 having a general structure. Referring to FIG. 2A, first and second electrodes 11 and 12 are spaced apart from each other, and first and second photodetection layers 21 and 22 are provided between the first and second electrodes 11 and 12. The first photodetection layer 21 provided on a bottom surface of the first electrode 11 is made of or include $MoS_2$, and the second photodetection layer 22 provided on a top surface of the second electrode 12 is made of or include n-type Si.

FIG. 2B illustrates the image sensor 100' according to an example embodiment. Referring to FIG. 2B, first and second electrodes 111' and 112' are spaced apart from each other, and first and second photodetection layers 121' and 122' are provided between the first and second electrodes 111' and 112'. An interlayer 130' is provided between the first and second photodetection layers 121' and 122'. The first photodetection layer 121' on a bottom surface of the first electrode 111' is made of or include $MoS_2$, and the second photodetection layer 122' provided on a top surface of the second electrode 112' is made of or include n-type Si. The interlayer 130' provided between the first and second photodetection layers 121' and 122' is made of or include multilayer graphene.

Figure 3:
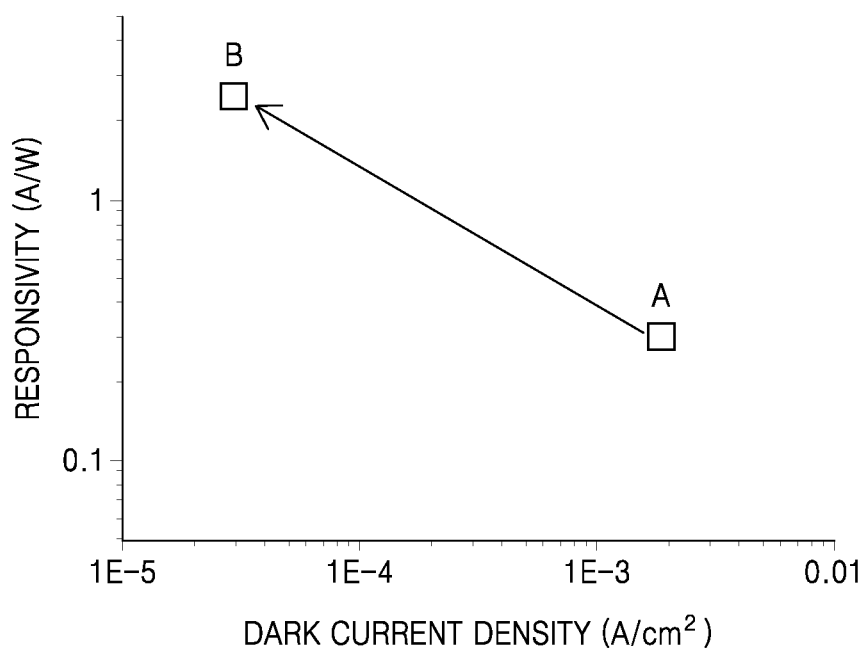
FIG. 3 is a graph comparatively showing dark currents and photoelectric conversion efficiencies of the image sensors illustrated in FIGS. 2A and 2B.

FIG. 3 is a graph comparatively showing dark currents and photoelectric conversion efficiencies of the image sensor 10 illustrated in FIG. 2A, and the image sensor 100' illustrated in FIG. 2B. In FIG. 3, "A" indicates the image sensor 10 having a general structure, which is illustrated in FIG. 2A, and "B" indicates the image sensor 100' according to an example embodiment, which is illustrated in FIG. 2B. Herein, a laser used as a light source has a wavelength of about 850 nm and an output of about 1 μW, and multilayer graphene of the interlayer 130' has a thickness of about 14 nm.

Referring to FIG. 3, compared to the image sensor A having a general structure, dark current of the image sensor B according to an example embodiment is reduced, and responsivity thereof is increased. Herein, responsivity indicates the ability of generating an electrical signal in response to external light, and a high responsivity refers to a high photoelectric conversion efficiency. As such, it is shown that the image sensor B according to an example embodiment may both achieve a low dark current and a high photoelectric conversion efficiency.

Figure 4A:
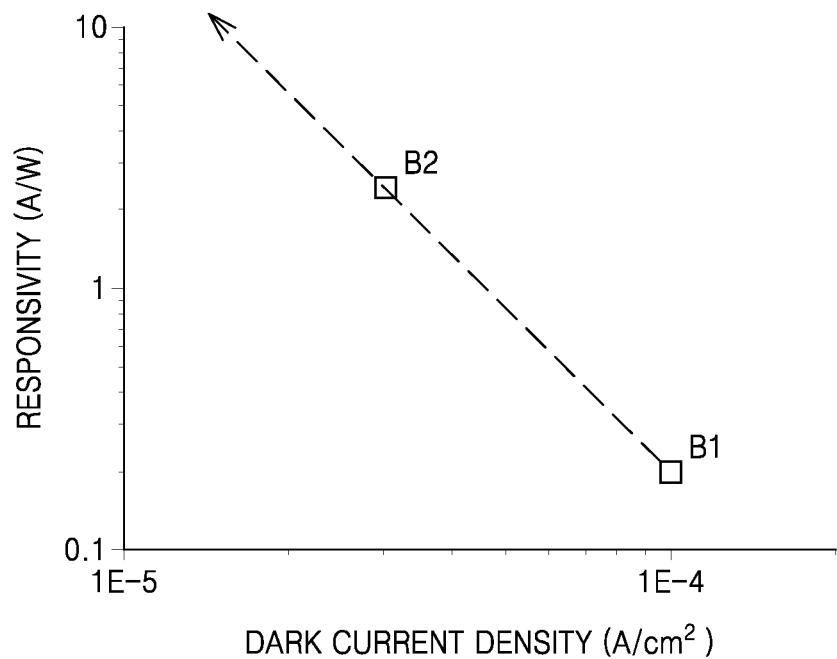
FIGS. 4A and 4B are graphs showing dark current and photoelectric conversion efficiency based on a thickness variation of an interlayer in the image sensor according to an example embodiment.
Figure 4B:
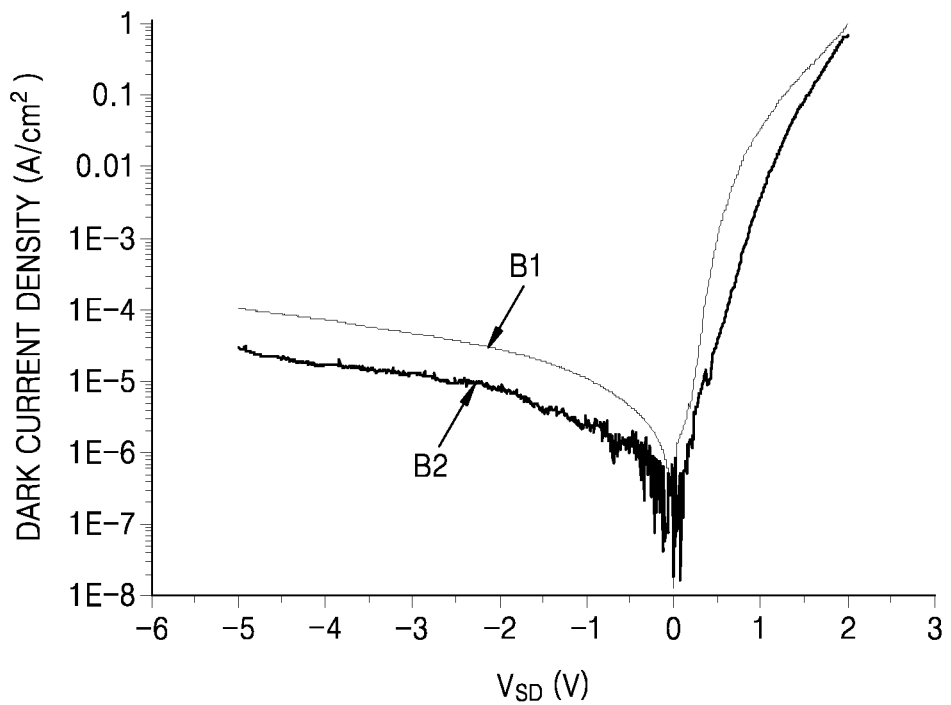

FIGS. 4A and 4B are graphs showing dark current and photoelectric conversion efficiency based on a thickness variation of the interlayer 130' in the image sensor 100' according to an example embodiment.

FIG. 4A shows dark current and photoelectric conversion efficiency of the image sensor 100' illustrated in FIG. 2B, based on a thickness variation of the interlayer 130'. In FIG. 4A, "B1" indicates a case when the interlayer 130' has a thickness of about 6 nm, and "B2" indicates a case when the interlayer 130' has a thickness of about 14 nm. Herein, a measurement bias voltage $V_{SD}$ of about −5V is applied between the first and second photodetection layers 121' and 122'. Referring to FIG. 4A, when the thickness of the interlayer 130' is increased, the dark current is reduced and the photoelectric conversion efficiency is increased.

FIG. 4B shows the dark current of the image sensor 100' illustrated in FIG. 2B, based on a measurement bias voltage variation. In FIG. 4B, "B1" indicates a case when the interlayer 130' has a thickness of about 6 nm, "B2" indicates a case when the interlayer 130' has a thickness of about 14 nm, and $V_{SD}$ indicates the measurement bias voltage applied between the first and second photodetection layers 121' and 122'. As illustrated in FIG. 4B, when the thickness of the interlayer 130' is increased, the dark current is reduced. As such, it is shown that the image sensor 100' according to an example embodiment may reduce the dark current and increase the photoelectric conversion efficiency by increasing the thickness of the interlayer 130'.

Figure 5:
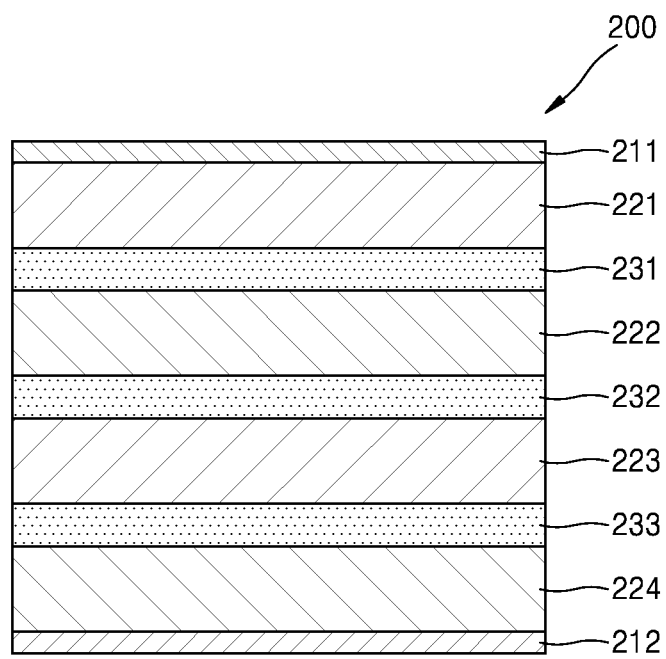
FIG. 5 is a cross-sectional view of an image sensor according to another example embodiment.

FIG. 5 is a cross-sectional view of an image sensor 200 according to another example embodiment. The following description is focused on the differences from the previous example embodiment.

Referring to FIG. 5, the image sensor 200 includes first and second electrodes 211 and 212 spaced apart from each other, a plurality of, for example, first to fourth, photodetection layers 221 to 224 provided between the first and second electrodes 211 and 212, and a plurality of, for example, first to third, interlayers 231 to 233 provided between the first to fourth photodetection layers 221 to 224.

The first and second electrodes 211 and 212 may be, for example, an upper electrode and a lower electrode, respectively. At least one of the first and second electrodes 211 and 212 may be a transparent electrode. Herein, the transparent electrode may include, for example, TCO or graphene.

When external light is incident on the first electrode 211 serving as an upper electrode, the first electrode 211 may be a transparent electrode. In this case, the second electrode 212 may be a metal electrode. However, the second electrode 212 is not limited thereto and may also be a transparent electrode. When external light is incident on the second electrode 212 serving as a lower electrode, the second electrode 212 may be a transparent electrode and the first electrode 211 may be a metal electrode. However, the first electrode 211 is not limited thereto and may also be a transparent electrode.

The first to fourth photodetection layers 221 to 224 may be stacked, for example sequentially stacked, on one another between the first and second electrodes 211 and 212. The first to fourth photodetection layers 221 to 224 convert incident light into an electrical signal, and may include a semiconductor material. Herein, the semiconductor material may include at least one of, for example, Si, TMDC, quantum dots, and an organic semiconductor material, but is not limited thereto. TMDC refers to a semiconductor material having a two-dimensional (2D) crystal structure. TMDC may include one transition metal selected among Mo, W, Nb, V, Ta, Ti, Zr, Hf, Tc, Re, and Cu, and one chalcogen element selected among S, Se, and Te. The semiconductor material of the first to fourth photodetection layers 221 to 224 may be doped with a p-type dopant or an n-type dopant to adjust photocurrent or dark current.

The first interlayer 231 may be provided between the first and second photodetection layers 221 and 222, the second interlayer 232 may be provided between the second and third photodetection layers 222 and 223, and the third interlayer 233 may be provided between the third and fourth photodetection layers 223 and 224. Herein, the first to third interlayers 231 to 233 may include a metallic or semi metallic material having anisotropy in electrical conductivity, as described above. The metallic material or semi metallic material having anisotropy in electrical conductivity may include, for example, graphene or $WTe_2$. Graphene or $WTe_2$ has a good electrical conductivity in a planar direction, but has a very low electrical conductivity in a direction perpendicular to the planar direction. Herein, graphene may have a monolayer or multilayer structure.

Each of the first to third interlayers 231 to 233 may have a thickness of, for example, about 0.05 nm to about 10 cm. Specifically, each or at least one of the first to third interlayers 231 to 233 may have a thickness of about 0.1 nm to about 100 μm, but is not limited thereto. The material of the first to third interlayers 231 to 233 may be doped with a p-type dopant or an n-type dopant.

As in the example embodiment, since the first to third interlayers 231 to 233 including the metallic or semi metallic material having anisotropy in electrical conductivity are inserted between the first to fourth photodetection layers 221 to 224, dark current may be reduced. In addition, when external light is incident on the first to third interlayers 231 to 233, photocurrent may be additionally generated between the first to fourth photodetection layers 221 to 224 and the first to third interlayers 231 to 233, and thus photoelectric conversion efficiency may be increased. As such, the image sensor 200 configured to both achieving a high photoelectric conversion efficiency and a low dark current may be implemented.

In the above description, four photodetection layers, e.g., the first to fourth photodetection layers 221 to 224, are provided between the first and second electrodes 211 and 212 and three interlayers, e.g., the first to third interlayers 231 to 233, are provided between the first to fourth photodetection layers 221 to 224. However, the example embodiment is not limited thereto, and the numbers and thicknesses of photodetection layers and interlayers provided between the first and second electrodes 211 and 212 may be variously changed.

Figure 6:
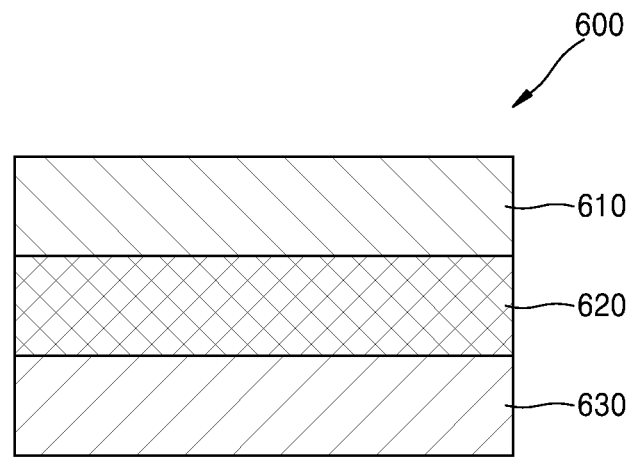
FIG. 6 is a cross-sectional view of a color image sensor according to another example embodiment.

FIG. 6 is a cross-sectional view of a color image sensor 600 according to another example embodiment.

Referring to FIG. 6, the color image sensor 600 includes first to third image sensors 610, 620, and 630 vertically stacked on one another. Herein, each of the first to third image sensors 610, 620, and 630 may detect light of a certain color of a specific wavelength band, as an electrical signal.

For example, when external light is incident from above the color image sensor 600, the first to third image sensors 610, 620, and 630 may be a blue image sensor, a green image sensor, and a red image sensor, respectively. In this case, the first image sensor 610 may convert blue light of the incident light into an electrical signal, and the second image sensor 620 may convert green light of light transmitted through the first image sensor 610, into an electrical signal. The third image sensor 630 may convert red light of light transmitted through the first and second image sensors 610 and 620, into an electrical signal.

When external light is incident from under the color image sensor 600, the first to third image sensors 610, 620, and 630 may be a red image sensor, a green image sensor, and a blue image sensor, respectively. Although the color image sensor 600 includes red, green, and blue image sensors in the above description, the color image sensor 600 is not limited thereto and may include image sensors of various colors.

Each of the first to third image sensors 610, 620, and 630 may be the image sensor 100 or 200 described above in relation to FIG. 1 or 5. Accordingly, each or at least one of the first to third image sensors 610, 620, and 630 may include an interlayer(s) inserted between photodetection layers and including a metallic or semi metallic material having anisotropy in electrical conductivity, and thus a low dark current and a high photoelectric conversion efficiency may be achieved. The color image sensor 600 may be produced by vertically stacking the first to third image sensors 610, 620, and 630 having high sensitivities of detecting light of different colors. Although all of the first to third image sensors 610, 620, and 630 include interlayers in the above description, only a part of the first to third image sensors 610, 620, and 630 may include an interlayer(s).

Figure 7:
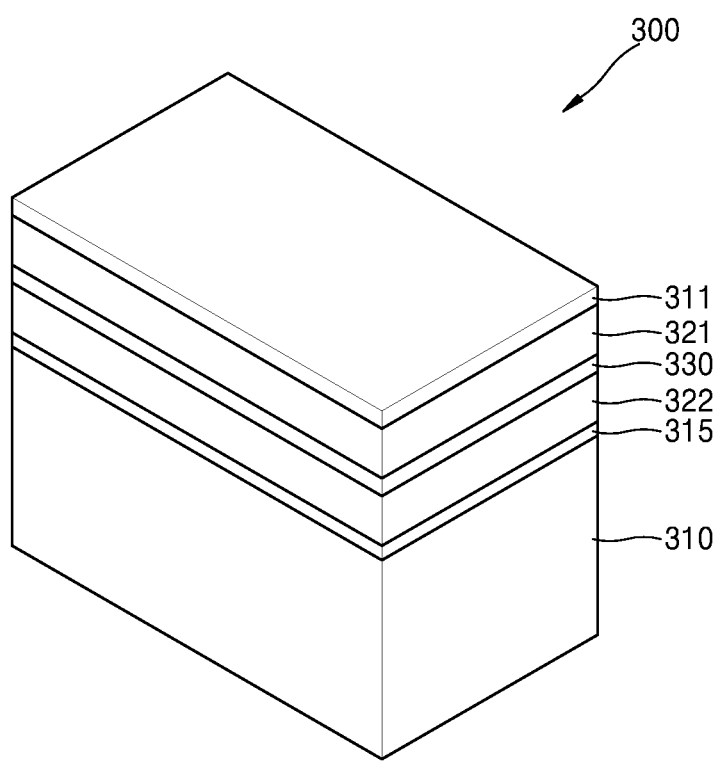
FIG. 7 is a perspective view of an image sensor according to another example embodiment.
Figure 8:
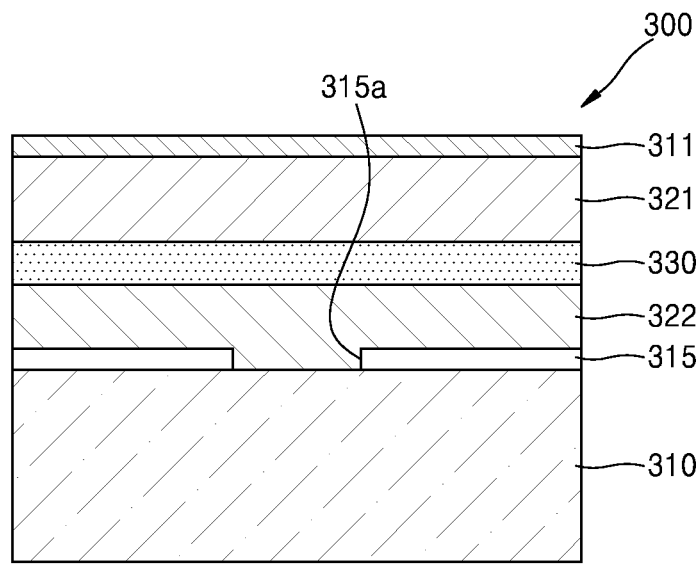
FIG. 8 is a cross-sectional view of the image sensor illustrated in FIG. 7.

FIG. 7 is a perspective view of an image sensor 300 according to another example embodiment. FIG. 8 is a cross-sectional view of the image sensor 300 illustrated in FIG. 7.

Referring to FIGS. 7 and 8, a first electrode 311 is provided above a conductive substrate 310. First and second photodetection layers 321 and 322 are provided between the conductive substrate 310 and the first electrode 311, and an interlayer 330 is provided between the first and second photodetection layers 321 and 322.

The conductive substrate 310 may include, for example, a silicon substrate. However, the conductive substrate 310 is not limited thereto and may include various other conductive materials. The conductive substrate 310 may serve as a second electrode which is a lower electrode. Although not shown in FIGS. 7 and 8, readout circuits for reading an electrical signal generated due to light absorption may be provided on the conductive substrate 310, and may include one or more transistors and capacitors, a plurality of wiring structures, etc.

The first electrode 311 is an upper electrode and is spaced apart from and provided above the conductive substrate 310. The first electrode 311 may be a transparent electrode. The transparent electrode may include, for example, TCO or graphene. Herein, TCO may include at least one material selected from, for example, ITO, IZO, ZnO, $SnO_2$, ATO, AZO, GZO, $TiO_2$, and FTO. However, TCO is not limited thereto. Graphene may have a monolayer or multilayer structure.

The first and second photodetection layers 321 and 322 are provided between the first electrode 311 and the conductive substrate 310. The first photodetection layer 321 is provided on a bottom surface of the first electrode 311, and the second photodetection layer 322 is provided on a top surface of the conductive substrate 310.

The first and second photodetection layers 321 and 322 convert incident light into an electrical signal, and may include a semiconductor material. Herein, the first and second photodetection layers 321 and 322 may convert light of a certain color into an electrical signal.

The semiconductor material of the first and second photodetection layers 321 and 322 may include at least one of, for example, Si, TMDC, quantum dots, and an organic semiconductor material, but is not limited thereto. TMDC may include one transition metal selected among Mo, W, Nb, V, Ta, Ti, Zr, Hf, Tc, Re, and Cu, and one chalcogen element selected among S, Se, and Te. For example, TMDC may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or CuS, but is not limited thereto. The semiconductor material of the first and second photodetection layers 321 and 322 may be doped with a p-type dopant or an n-type dopant to adjust photocurrent or dark current.

An insulating layer 315 may be further provided between the conductive substrate 310 and the second photodetection layer 322. The insulating layer 315 may include, for example, silicon oxide but is not limited thereto. As illustrated in FIG. 8, a via hole 315a is provided in the insulating layer 315. The second photodetection layer 322 and the conductive substrate 310 may be electrically connected to each other through the via hole 315a. As such, photocurrent generated due to light absorption may flow from the second photodetection layer 322 toward the conductive substrate 310 serving as a lower electrode.

The interlayer 330 is provided between the first and second photodetection layers 321 and 322. Herein, the interlayer 330 may include a metallic or semi metallic material having anisotropy in electrical conductivity, as described above. The interlayer 330 may include, for example, graphene having at least one layer, or $WTe_2$. Graphene and $WTe_2$ have a good electrical conductivity in a planar direction, but have a very low electrical conductivity in a direction substantially perpendicular to the planar direction.

The interlayer 330 may have a thickness of, for example, about 0.05 nm to about 10 cm. Specifically, the interlayer 330 may have a thickness of about 0.1 nm to about 100 μm, but is not limited thereto. The material of the interlayer 330 may be doped with a p-type dopant or an n-type dopant.

Since the interlayer 330 including the metallic or semi metallic material having anisotropy in electrical conductivity is inserted between the first and second photodetection layers 321 and 322, dark current may be reduced and photoelectric conversion efficiency may be increased at the same time as described above.

The dark current and the photoelectric conversion efficiency may be adjusted by controlling the thickness of the interlayer 330 or controlling band alignment between the semiconductor material of the first and second photodetection layers 321 and 322 and the metallic or semi metallic material of the interlayer 330. Herein, the band alignment may be performed by controlling a Fermi level of at least one of the semiconductor material of the first and second photodetection layers 321 and 322 and the material of the interlayer 330. The Fermi level may be controlled by adjusting, for example, a doping density of at least one of the semiconductor material of the first and second photodetection layers 321 and 322 and the material of the interlayer 330.

In the image sensor 300 according to an example embodiment, when external light is not incident on the image sensor 300, since the interlayer 330 serves as a blocking layer, dark current may be reduced. In addition, when external light is incident through the transparent first electrode 311 serving as an upper electrode, since photocurrent is generated by the first and second photodetection layers 321 and 322 and is additionally generated by the interlayer 130 between the first and second photodetection layers 321 and 322 and the interlayer 330 due to an internal photoemission effect, a photo-thermionic effect, a band-to-band excitation effect, or the like, photoelectric conversion efficiency may be increased.

In the above description, two photodetection layers, e.g., the first and second photodetection layers 321 and 322, and one interlayer, e.g., the interlayer 330, are provided between the first electrode 311 serving as an upper electrode and the conductive substrate 310 serving as a lower electrode. However, the example embodiment is not limited thereto, and the numbers of photodetection layers and interlayers provided between the first electrode 311 and the conductive substrate 310 may be variously changed. A color image sensor including a vertical stack of image sensors of different colors may be implemented using the image sensor 300 according to the example embodiment.

Figure 9:
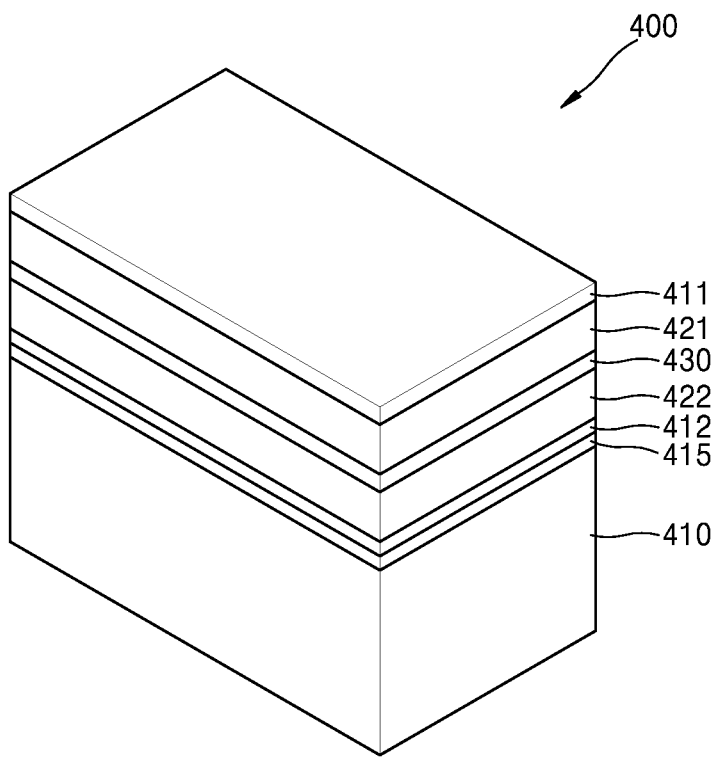
FIG. 9 is a perspective view of an image sensor according to another example embodiment.
Figure 10:
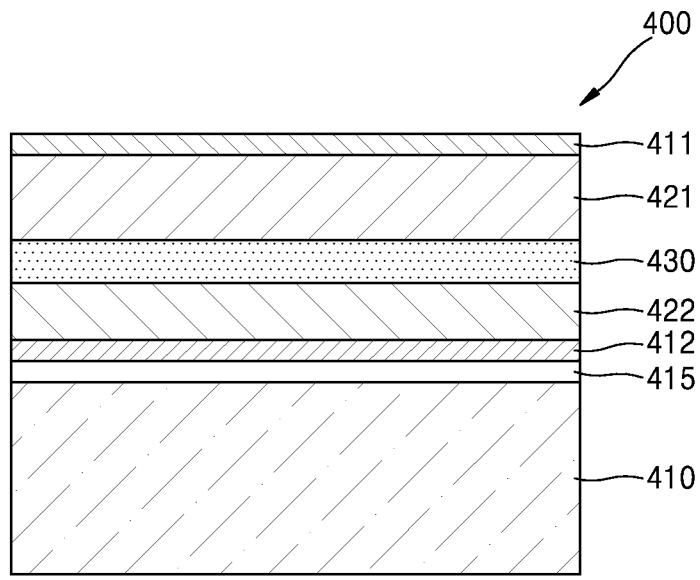
FIG. 10 is a cross-sectional view of the image sensor illustrated in FIG. 9.

FIG. 9 is a perspective view of an image sensor 400 according to another example embodiment. FIG. 10 is a cross-sectional view of the image sensor 400 illustrated in FIG. 9.

Referring to FIGS. 9 and 10, first and second electrodes 411 and 412 are spaced apart from each other and are provided above a conductive substrate 410. First and second photodetection layers 421 and 422 are provided between the first and second electrodes 411 and 412, and an interlayer 430 is provided between the first and second photodetection layers 421 and 422.

The conductive substrate 410 may include, for example, a silicon substrate. However, the conductive substrate 410 is not limited thereto and may include various other conductive materials. Although not shown in FIGS. 9 and 10, readout circuits for reading an electrical signal generated due to light absorption may be provided on the conductive substrate 410.

The first and second electrodes 411 and 412 may be an upper electrode and a lower electrode, respectively. The first electrode 411 serving as an upper electrode may be, for example, a transparent electrode. The transparent electrode may include, for example, TCO or graphene. Herein, TCO may include at least one material selected from, for example, ITO, IZO, ZnO, SnO$_2$, ATO, AZO, GZO, TiO$_2$, and FTO. However, TCO is not limited thereto. Graphene may have a monolayer or multilayer structure.

The second electrode 412 serving as a lower electrode may be a metal electrode. The metal electrode may include at least one material selected from, for example, Al, Cu, Ti, Au, Pt, Ag, and Cr. However, the metal electrode is not limited thereto. Alternatively, the second electrode 412 may be a transparent electrode.

An insulating layer 415 may be provided between the second electrode 412 and the conductive substrate 410 to insulate the second electrode 412 and the conductive substrate 410 from each other. The insulating layer 415 may include, for example, silicon oxide, but is not limited thereto, and may include various other insulating materials.

In at least one example embodiment, the first and second photodetection layers 421 and 422 are provided between the first and second electrodes 411 and 412. The first photodetection layer 421 is provided on a bottom surface of the first electrode 411, and the second photodetection layer 422 is provided on a top surface of the second electrode 412. The first and second photodetection layers 421 and 422 convert incident light into an electrical signal, and may include a semiconductor material. The semiconductor material of the first and second photodetection layers 421 and 422 may include at least one of, for example, Si, TMDC, quantum dots, and an organic semiconductor material, but is not limited thereto. The semiconductor material of the first and second photodetection layers 421 and 422 may be doped with a p-type dopant or an n-type dopant to adjust photocurrent or dark current.

The interlayer 430 is provided between the first and second photodetection layers 421 and 422. The interlayer 430 may include a metallic or semi metallic material having anisotropy in electrical conductivity, e.g., graphene or WTe$_2$, as described above. The interlayer 430 may have a thickness of, for example, about 0.05 nm to about 10 cm. Specifically, the interlayer 430 may have a thickness of about 0.1 nm to about 100 μm, but is not limited thereto. The material of the interlayer 430 may be doped with a p-type dopant or an n-type dopant.

In the image sensor 400 according to the example embodiment, when external light is not incident on the image sensor 400, since the interlayer 430 serves as a blocking layer, dark current may be reduced. In addition, when external light is incident through the transparent first electrode 411 serving as an upper electrode, since the first and second photodetection layers 421 and 422 generate photocurrent and the interlayer 430 additionally generates photocurrent between the first and second photodetection layers 421 and 422 and the interlayer 430, photoelectric conversion efficiency may be increased.

In the above description, two photodetection layers, e.g., the first and second photodetection layers 421 and 422, and one interlayer, e.g., the interlayer 430, are provided between the first electrode 411 serving as an upper electrode and the second electrode 412 serving as a lower electrode. However, the example embodiment is not limited thereto, and the numbers of photodetection layers and interlayers provided between the first and second electrodes 411 and 412 may be variously changed. A color image sensor including a vertical stack of image sensors of different colors may be implemented using the image sensor 400 according to the example embodiment.

Figure 11:
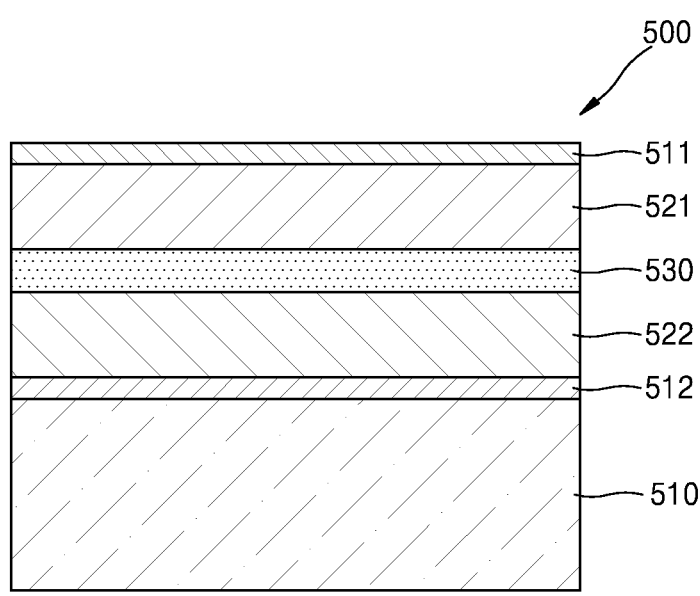
FIG. 11 is a cross-sectional view of an image sensor according to another example embodiment.

FIG. 11 is a cross-sectional view of an image sensor 500 according to another example embodiment.

Referring to FIG. 11, first and second electrodes 511 and 512 are spaced apart from each other and provided on an insulating substrate 510. First and second photodetection layers 521 and 522 are provided between the first and second electrodes 511 and 512, and an interlayer 530 is provided between the first and second photodetection layers 521 and 522.

The first and second electrodes 511 and 512 may be an upper electrode and a lower electrode, respectively. The first electrode 511 serving as an upper electrode may be a transparent electrode. The transparent electrode may include, for example, TCO or graphene. The second electrode 512 serving as a lower electrode may be a metal electrode. However, the second electrode 512 is not limited thereto and may also be a transparent electrode.

The first and second photodetection layers 521 and 522 are provided between the first and second electrodes 511 and 512. The first photodetection layer 521 is provided on a bottom surface of the first electrode 511, and the second photodetection layer 522 is provided on a top surface of the second electrode 512. The first and second photodetection layers 521 and 522 convert incident light into an electrical signal, and may include a semiconductor material. The semiconductor material may include at least one of, for example, Si, TMDC, quantum dots, and an organic semiconductor material, but is not limited thereto. The semiconductor material of the first and second photodetection layers 521 and 522 may be doped with a p-type dopant or an n-type dopant to adjust photocurrent or dark current.

The interlayer 530 is provided between the first and second photodetection layers 521 and 522. The interlayer 530 may include a metallic or semi-metallic material having anisotropy in electrical conductivity, e.g., graphene or WTe$_2$, as described above. The interlayer 530 may have a thickness of, for example, about 0.05 nm to about 10 cm. Specifically, the interlayer 530 may have a thickness of about 0.1 nm to about 100 μm, but is not limited thereto. The material of the interlayer 530 may be doped with a p-type dopant or an n-type dopant.

In the image sensor 500 according to the example embodiment, when external light is not incident on the image sensor 500, since the interlayer 530 serves as a blocking layer, dark current may be reduced. In addition, when external light is incident through the transparent first electrode 511 serving as an upper electrode, since the first and second photodetection layers 521 and 522 generate photocurrent and the interlayer 530 additionally generates photocurrent between the first and second photodetection layers 521 and 522 and the interlayer 530, photoelectric conversion efficiency may be increased.

In the above description, two photodetection layers, e.g., the first and second photodetection layers 521 and 522, and one interlayer, e.g., the interlayer 530, are provided between the first electrode 511 serving as an upper electrode and the second electrode 512 serving as a lower electrode. However, the example embodiment is not limited thereto, and the numbers of photodetection layers and interlayers provided between the first and second electrodes 511 and 512 may be variously changed. A color image sensor including a vertical stack of image sensors of different colors may be implemented using the image sensor 500 according to the example embodiment.

According to example embodiments, since an interlayer including a metallic or semi metallic material having anisotropy in electrical conductivity is inserted between photodetection layers, when external light is not incident, dark current may be reduced. In addition, when external light is incident, since the photodetection layers generate photocurrent and the interlayer additionally generates photocurrent between the photodetection layers and the interlayer, photoelectric conversion efficiency may be increased. As such, an image sensor capable of both achieving a high photoelectric conversion efficiency and a low dark current may be implemented.

Figure 12A:
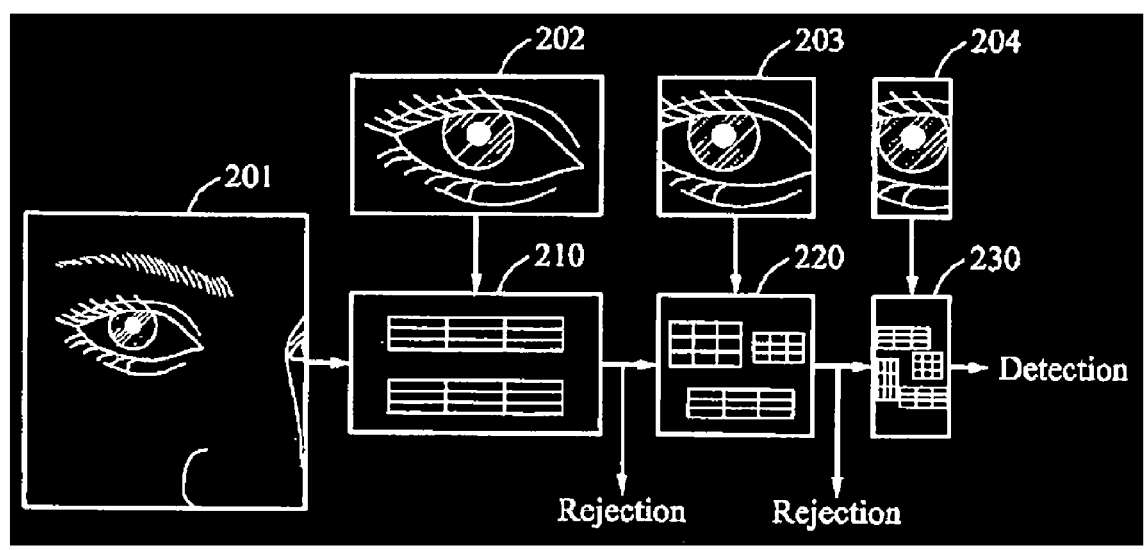
FIGS. 12A and 12B illustrate an example of a method of detecting a biometric region according to at least one example embodiment.
Figure 12B:
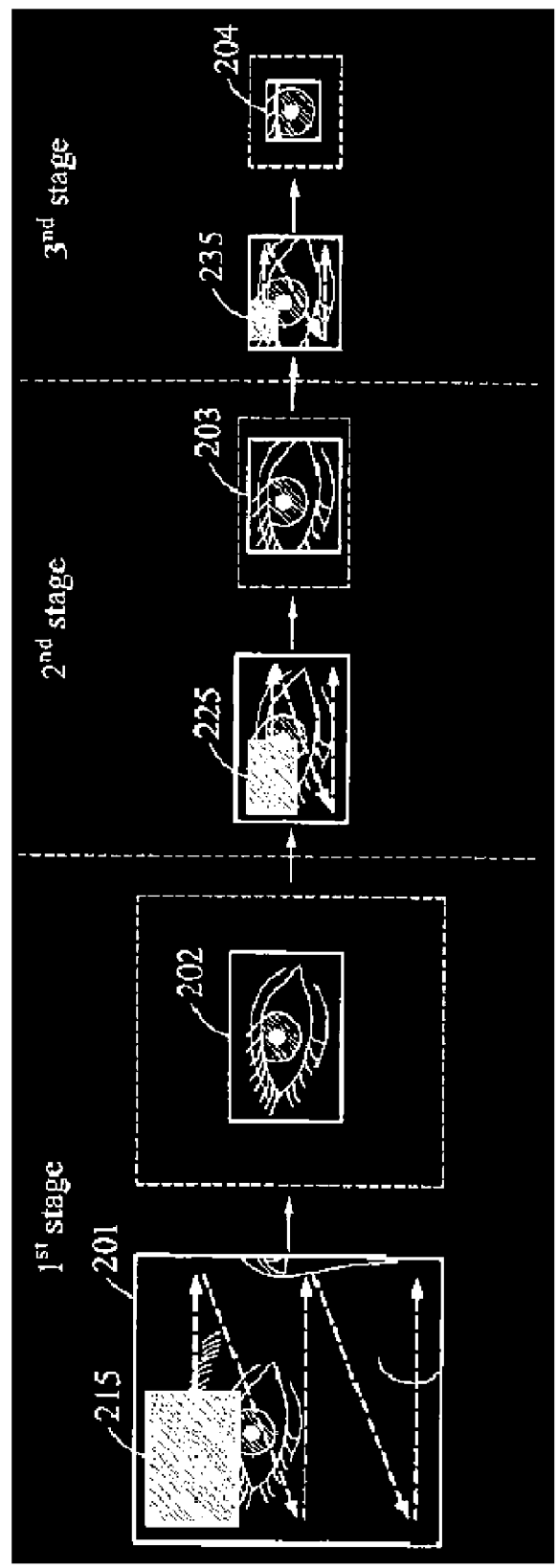

FIGS. 12A and 12B illustrate an example of a method of detecting a biometric region by an image sensor such as any one of the image sensors 100, 100', 200, 300, 400, 500 or 600 discussed above according to at least one example embodiment. Referring to FIG. 12A, a first classifier 210, a second classifier 220, and a third classifier 230 may recognize a biometric region in an input image 201. The first classifier 210, the second classifier 220, and the third classifier 230 may detect a biometric region having a different size for each stage based on a threshold learned in advance, and may correspond to first, second and third stages, respectively, of a multi-stage structure. For each of the multi-stages, a region of interest (ROI) may be set based on a different purpose or a different characteristic. For example, for the first stage, an ROI may be set to reduce a rate of misdetection. To reduce the rate of misdetection, the first classifier 210 may detect a wide ROI, for example, a region 202 including both eye corner points, by recognizing the region 202 in an input image 201. The first classifier 210 may reject a detection of a region other than an eye region in the input image 201.

As another example, for the second and third stages, ROIs may be set to increase a rate of detection by an image sensor such as any one of the image sensors 100, 100', 200, 300, 400, 500 or 600 discussed above. The second classifier 220 corresponding to the second stage may detect a region 203 including a pupil or an iris from a detection result of the first classifier 210. In this example, the second classifier 220 may reject a detection of an eye contour region such as an eye corner other than the pupil or iris in the region 202 including the eye.

The third classifier 230 corresponding to the third stage may detect a region 204 including only the pupil or iris from a detection result of the second classifier 220. In this example, the third classifier 230 may reject a detection of a region other than the pupil or iris and thus, the region 204 including only the pupil or iris may be ultimately detected.

FIG. 12B illustrates ROIs set to be in a different size for each stage. As an example, a first ROI, for example, the region 202 on the first stage may be detected from the input image 201 through a first detection window 215 of a first size. A second ROI, for example, the region 203 on the second stage may be detected from the first ROI 202 through a second detection window 225 of a second size. A third ROI, for example, the region 204 on the third stage may be detected from the second ROI 203 through a third detection window 235 of a third size.

Accordingly, an image sensor can acquire a quantum efficiency in a near-infrared (NIR) wavelength band that is typically greater than ½ of the quantum efficiency of a visible light band, and thus the sensitivity of the image sensor can be increased and an additional light source may no longer be required because of the higher sensitivity of iris recognition in a low light level environment. As such, technology such as mobile payment may be satisfactorily commercialized with security technology such as, for example, iris recognition. Furthermore, as a result of the increase in the sensitivity, a large pixel size is no longer required and thus the size of an embedded camera may be decreased.

Figure 13:
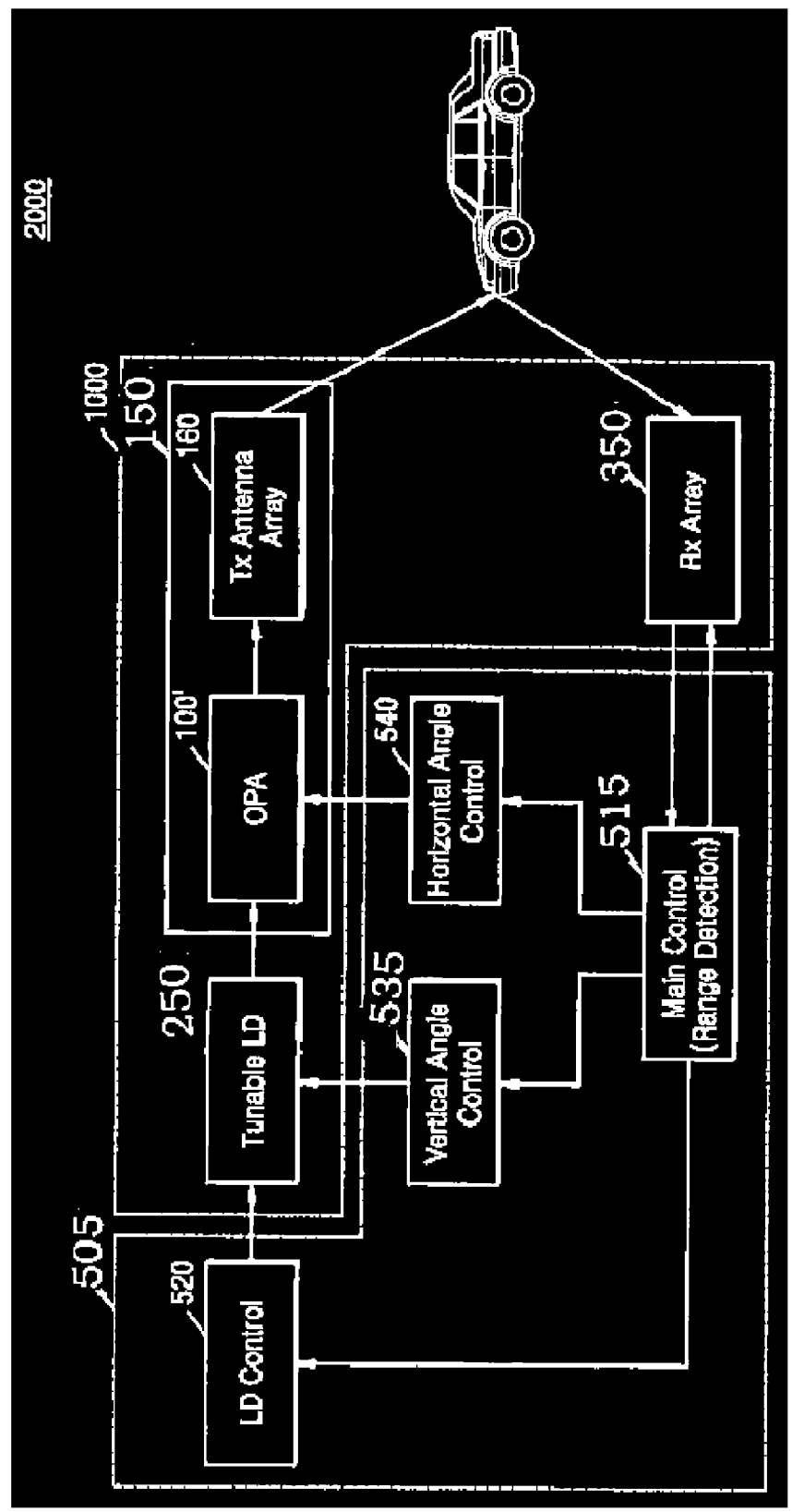
FIG. 13 is a diagram illustrating a configuration of a light detection and ranging (LiDAR) system including an optical phased array (OPA) according to some example embodiments.

FIG. 13 is a diagram illustrating a configuration of an example of an image sensor such as any one of the image sensors 100, 100', 200, 300, 400, 500 or 600 discussed above such as a light detection and ranging (LiDAR) system including an optical phased array (OPA) according to some example embodiments. In FIG. 13, the LiDAR system 2000 may include the OPA 150, the laser diode (LD) 250, the receiver 350, and a controller 505. As shown in FIG. 13, one or more LiDAR systems 2000 may be included in one or more portions of a vehicle such as an automobile. The vehicle may be configured to be driven manually, or autonomously. For example, the vehicle may be configured to be driven through an environment based on generation of data by one or more LiDAR systems 2000 included in the vehicle. Such navigation may include the vehicle being configured to navigate through an environment, in relation to an object located in the environment, based on data generated by the LiDAR system as a result of the LiDAR system emitting a laser beam into the environment and detecting the object in the environment, where the LiDAR system may detect the object based on detecting a reflection and/or scattering of the emitted laser beam off of the object.

In the LiDAR system 2000, the receiver 350 may include a plurality of photodiodes arranged as an array structure 'Rx array.' The antenna 160 may also be formed based on a bulk-silicon substrate such that a plurality of unit antennas are arranged in an array. Accordingly, 'Tx Antenna Array' is used to indicate the antenna 160 in FIG. 13.

The controller 505 may include an LD controller 520, a vertical angle controller 535, a horizontal angle controller 540, and a main controller 515. The LD controller 520 controls light output from the tunable LD 250. For example, the LD controller 520 may control a power supply to the tunable LD 250, switching on/off of the tunable LD 250, and the generation of Pulse Waves (PWs) or Continuous Waves (CWs) of the tunable LD 250.

The main controller 515 may control overall operations of the tunable LD controller 520, the vertical angle controller 535, the horizontal angle controller 540, and the receiver 350. Also, the main controller 515 may receive information about an optical signal reflected from the receiver 350 and may calculate a distance to an object. For example, the main controller 515 may calculate a distance to an object by using a time of flight (TOF) technology.

Figure 14:
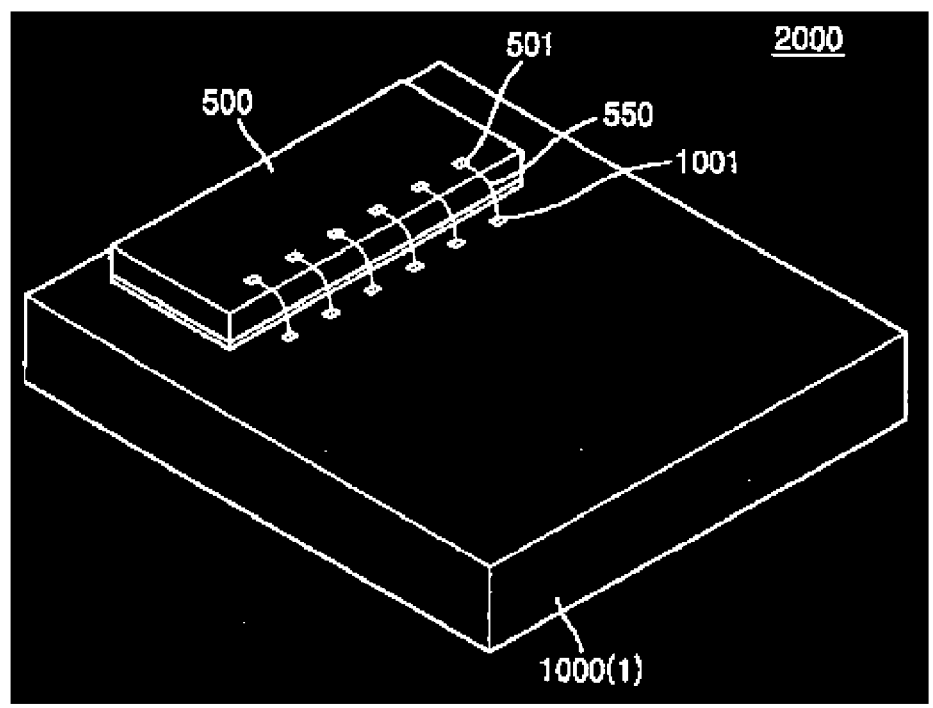
FIG. 14 is a perspective view of the LiDAR system of FIG. 13.

Referring to FIG. 14, the LiDAR system 2000 may include an optical integrated circuit 1000 and the controller 505. The optical integrated circuit 1000 may have a structure in which the OPA 150, the tunable LD 250, and the receiver 350 are integrated together in a bulk-silicon substrate 1. The controller 505 may be provided as one chip. For example, the LD controller 520, the vertical angle controller 535, the horizontal angle controller 540, and the main controller 515 constituting the controller 505 may be integrated together into one chip. For use in wire bonding, a plurality of first pads 501 may be formed on the controller 505 and a plurality of second pads 1001 may be formed on the optical integrated circuit 1000. The first pads 501 may be connected through wires 550 to the second pads 1001.

Figure 15:
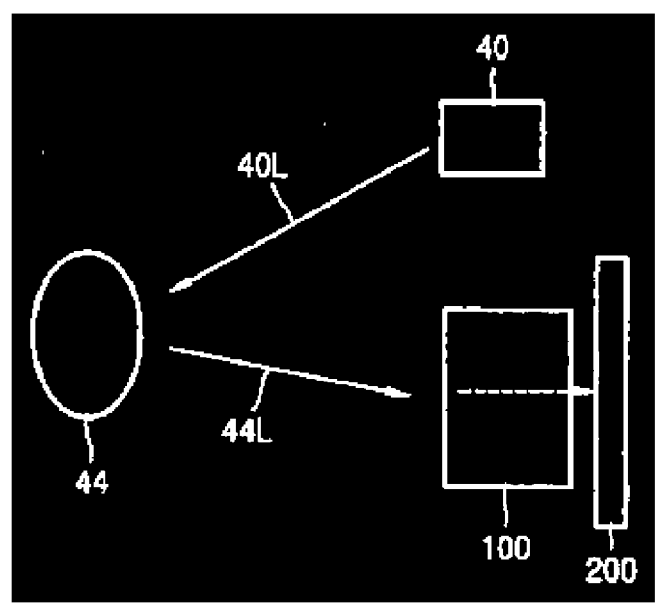
FIG. 15 is a diagram showing a schematic configuration of a depth image measuring system according to at least one example embodiment.

FIG. 15 is a diagram showing a schematic configuration of a depth image measuring system according to at least one example embodiment. In FIG. 15, the camera may include an illumination device 40, a light-modulating optical system 100, and an image sensor 200. Although image sensor 200 is illustrated in FIG. 15, other image sensors such as any one of the image sensors 100, 100', 300, 400, 500 or 600 discussed above may be part of the measuring system. Although not shown, the camera may include a controller (e.g., a special purpose processor) that controls the illumination device 40, the light-modulating optical system 100, and the image sensor 200, and a signal processor that processes a depth image signal that is generated from the image sensor 200. The illumination device 40 may be a light source that emits infrared rays. The illumination device 40 may include, for example, a LD or light-emitting diode (LED) that emits IR rays or near IR rays. Reference numeral 40L indicates light emitted from the illumination device 40 to an object 44. Light reflected 44L from the object 44 is input into the image sensor 200 through the light-modulating optical system 100. The image sensor 200 may be a mono (black and white) charge-coupled device (CCD) having no color filter, a complementary metal oxide semiconductor (CMOS) image sensor, or an organic image sensor. The light-modulating optical system 100 may include an optical modulator that may operate according to a TOF method and a stereo method. The optical modulator may be a device that controls optical transmittance by applying an electrical signal thereto and may be a high speed optical modulator that uses a compound semiconductor.

It should be understood that the example embodiments described herein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An image sensor comprising:
 first and second electrodes spaced apart from each other;
 a plurality of photodetection layers between the first and second electrodes and configured to convert incident light into an electrical signal, one or more of the plurality of photodetection layers including a semiconductor material; and
 an interlayer continuously between at least two of the plurality of photodetection layers and including a metallic or semi-metallic material having anisotropy in electrical conductivity, the interlayer being substantially one material and a solid layer, and comprising $WTe_2$.

2. The image sensor of claim 1, wherein the interlayer has a lower electrical conductivity in a direction perpendicular to the interlayer compared to an electrical conductivity in a direction parallel to the interlayer.

3. The image sensor of claim 1, wherein the interlayer has a thickness of about 0.05 nm to about 10 cm.

4. The image sensor of claim 3, wherein the interlayer has a thickness of about 0.1 nm to about 100 µm.

5. The image sensor of claim 1, wherein the photodetection layers comprise at least one of silicon (Si), transition metal dichalcogenides (TMDC), quantum dots, and an organic semiconductor material.

6. The image sensor of claim 1, wherein at least one of the first electrode and second electrode is a transparent electrode.

7. The image sensor of claim 1, wherein at least one of the photodetection layers and the interlayer are configured to adjust a photoelectric conversion efficiency and a dark current via control of a Fermi level.

8. The image sensor of claim 1, wherein the interlayer is configured to adjust a photoelectric conversion efficiency and a dark current via control of a thickness thereof, and at least one of the plurality of photodetection layers and the interlayer is configured to adjust a photoelectric conversion efficiency and a dark current via a doping density thereof.

9. An image sensor comprising:
 first and second electrodes separated by a plurality of photodetection layers, one or more of the plurality of photodetection layers including a semiconductor material; and
 an interlayer continuously between at least two of the plurality of photodetection layers, the interlayer having anisotropy in electrical conductivity, the interlayer being one material and a solid layer, and comprising $WTe_2$.

10. The image sensor of claim 9, wherein an electrical conductivity of the interlayer in a direction substantially perpendicular to the interlayer is lower than an electrical conductivity in a direction substantially parallel to the interlayer.

11. The image sensor of claim 9, wherein the plurality of photodetection layers and the interlayer are configured to generate electricity as a result of incident light.

* * * * *